United States Patent [19]

Brown et al.

[11] Patent Number: 4,764,049

[45] Date of Patent: Aug. 16, 1988

[54] UNIVERSAL EQUIPMENT MOUNTING STRUCTURE

[75] Inventors: Robert G. Brown, Annapolis; William J. Siegel, Silver Spring, both of Md.

[73] Assignee: Pace Incorporated, Laurel, Md.

[21] Appl. No.: 830,193

[22] Filed: Feb. 18, 1986

[51] Int. Cl.⁴ ............................ F16B 7/10; F04G 3/00
[52] U.S. Cl. ...................................... 403/24; 403/104; 403/378; 403/387; 403/405.1; 248/287; 108/143; 312/201
[58] Field of Search ................ 403/24, 104, 109, 378, 403/379, 387, 403, 405.1; 248/287, 298; 108/143, 20; 312/201; 269/71, 73

[56] References Cited

U.S. PATENT DOCUMENTS

| | | | |
|---|---|---|---|
| 1,878,821 | 9/1932 | Daugherty | 248/298 X |
| 2,767,951 | 10/1956 | Cousino | 403/387 X |
| 2,859,710 | 11/1958 | Elsner | 248/298 X |
| 2,928,704 | 3/1960 | Rappaport | 312/201 X |
| 2,979,303 | 12/1961 | Freeman | 248/287 |
| 3,207,097 | 9/1965 | Schreyer | 108/143 X |
| 3,227,414 | 1/1966 | Dean | 248/287 X |
| 3,453,011 | 7/1969 | Meinunger | 403/104 |
| 3,919,949 | 11/1975 | Rendleman | 108/143 X |
| 4,011,700 | 3/1977 | Sado | 403/104 X |
| 4,080,080 | 3/1978 | Cisler | 403/378 X |
| 4,471,898 | 9/1984 | Parker . | |

FOREIGN PATENT DOCUMENTS 2496226 12/1980 France ............................... 403/405

Primary Examiner—Randolph A. Reese
Assistant Examiner—Peter M. Cuomo
Attorney, Agent, or Firm—Gerald J. Ferguson, Jr.

[57] ABSTRACT

A mounting structure is disclosed including two pairs of spaced apart parallel rails with a longitudinal slot separating each of the pair. A trackway is formed under each pair of rails and a slider is slidable in the trackway and may be connected to a third rail orthogonally mounted on the pairs of rails, by means of a bolt passing through the slider and engaging a nut in a T-shaped slot in the third rail.

10 Claims, 8 Drawing Sheets

FIG. IB
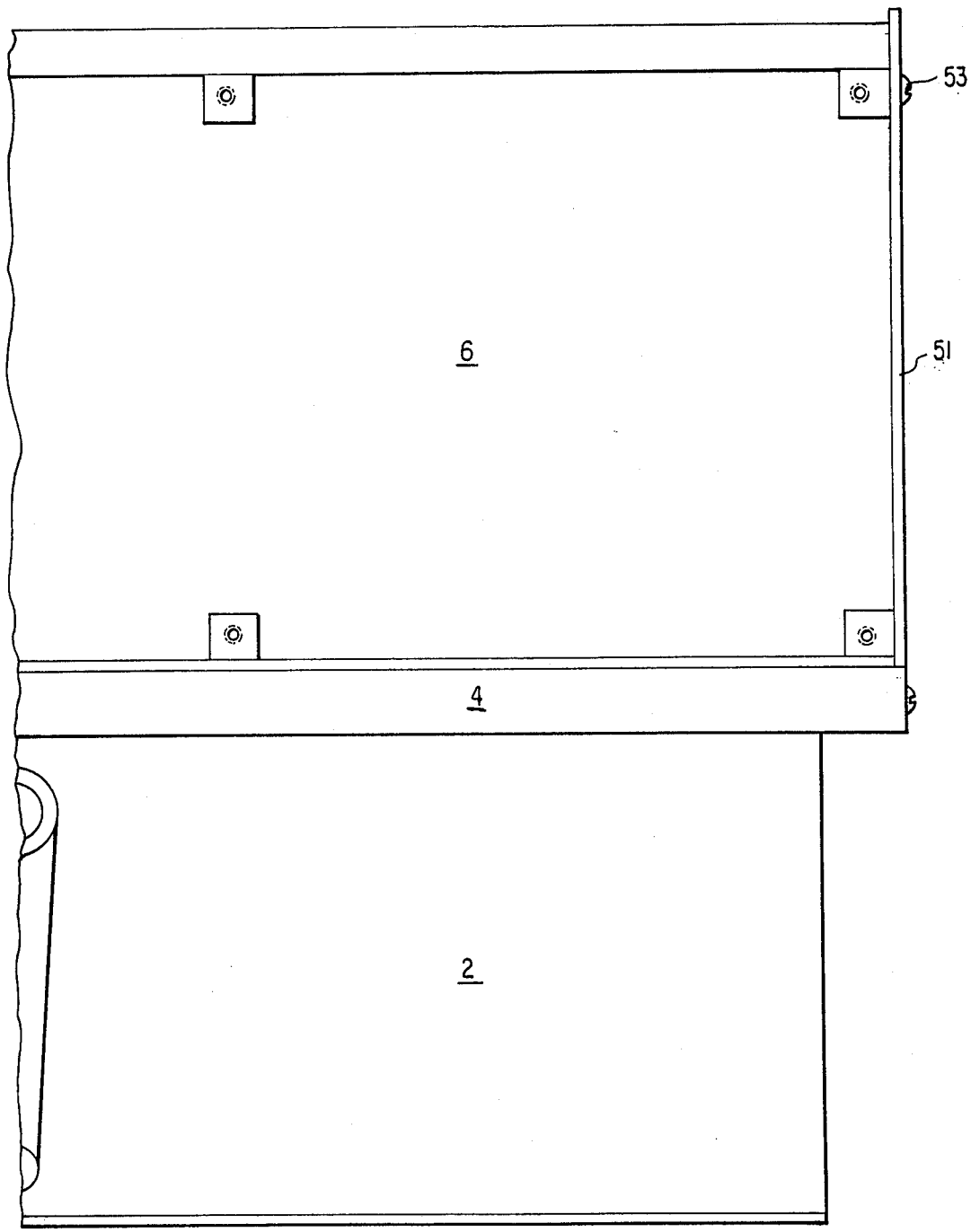

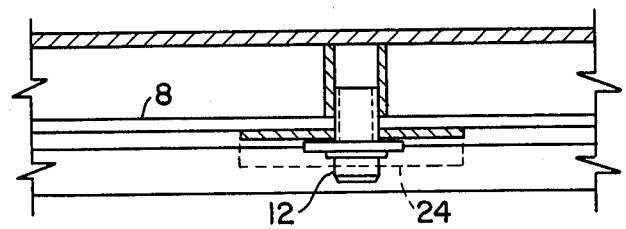
FIG. IC
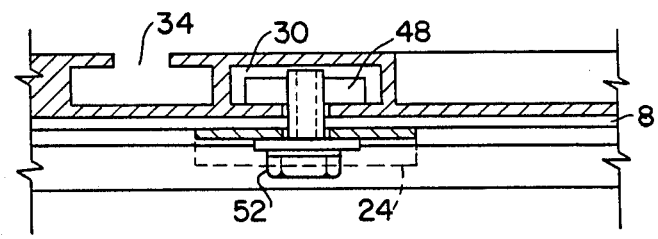
FIG. 4A

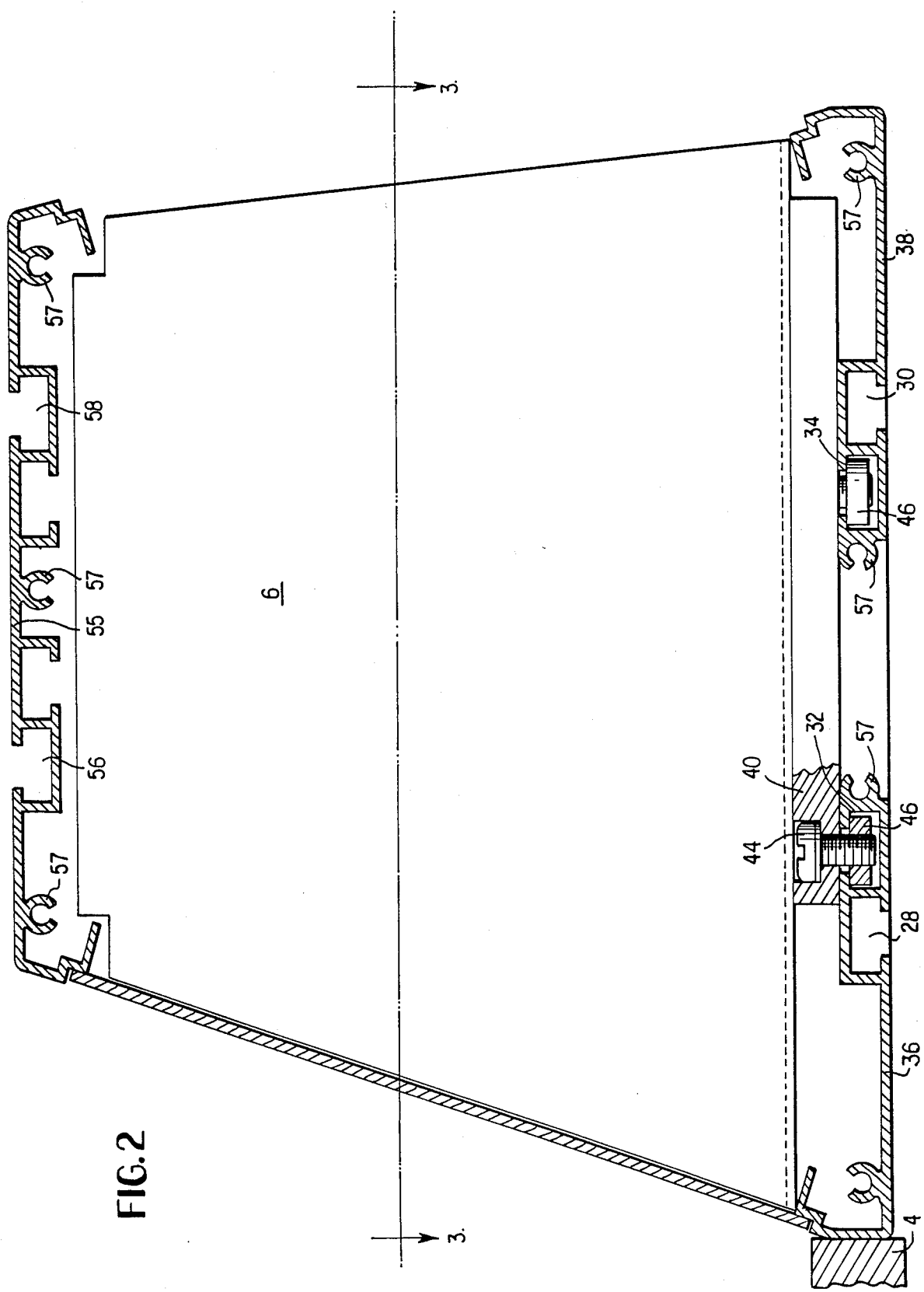

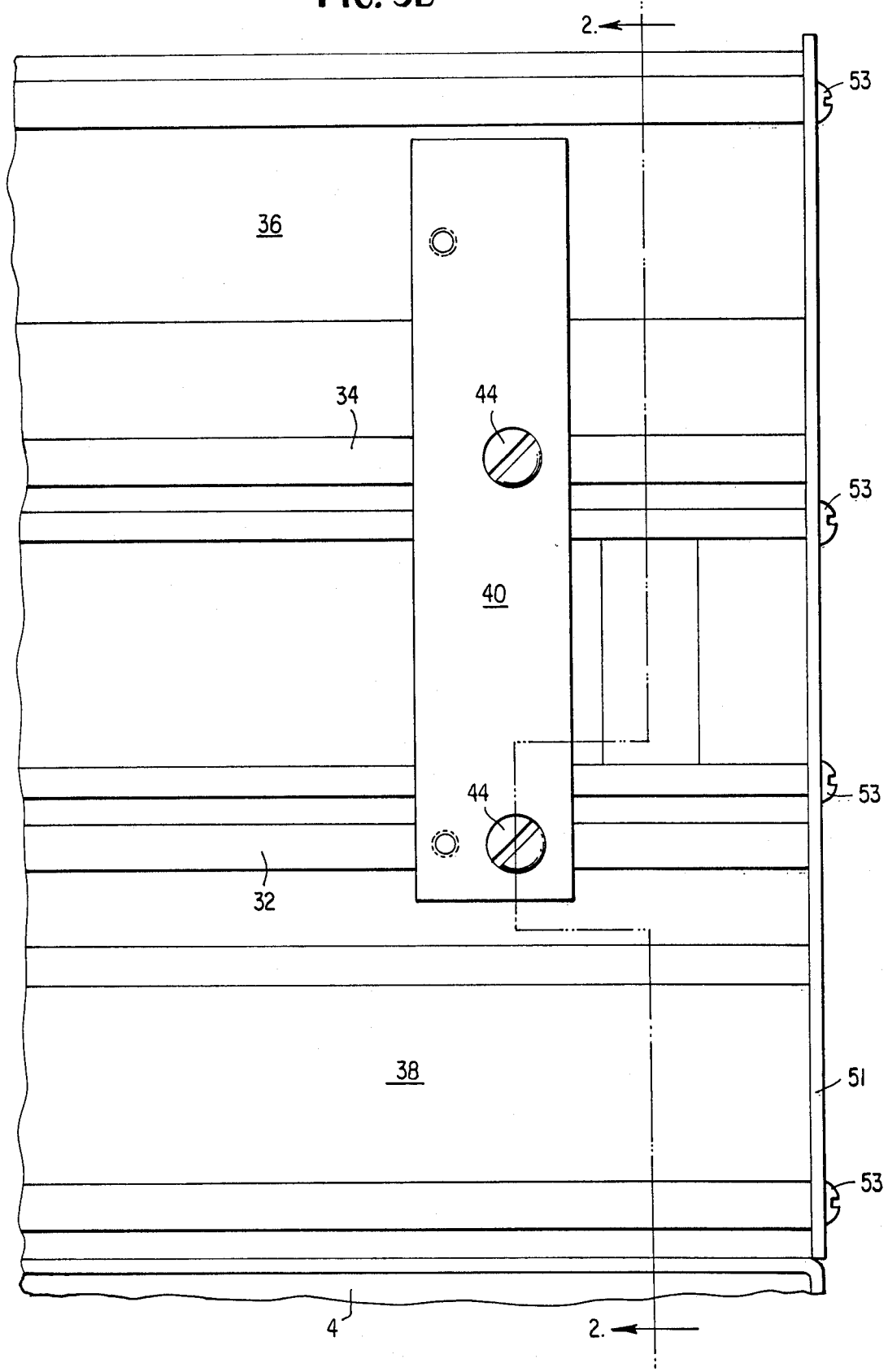

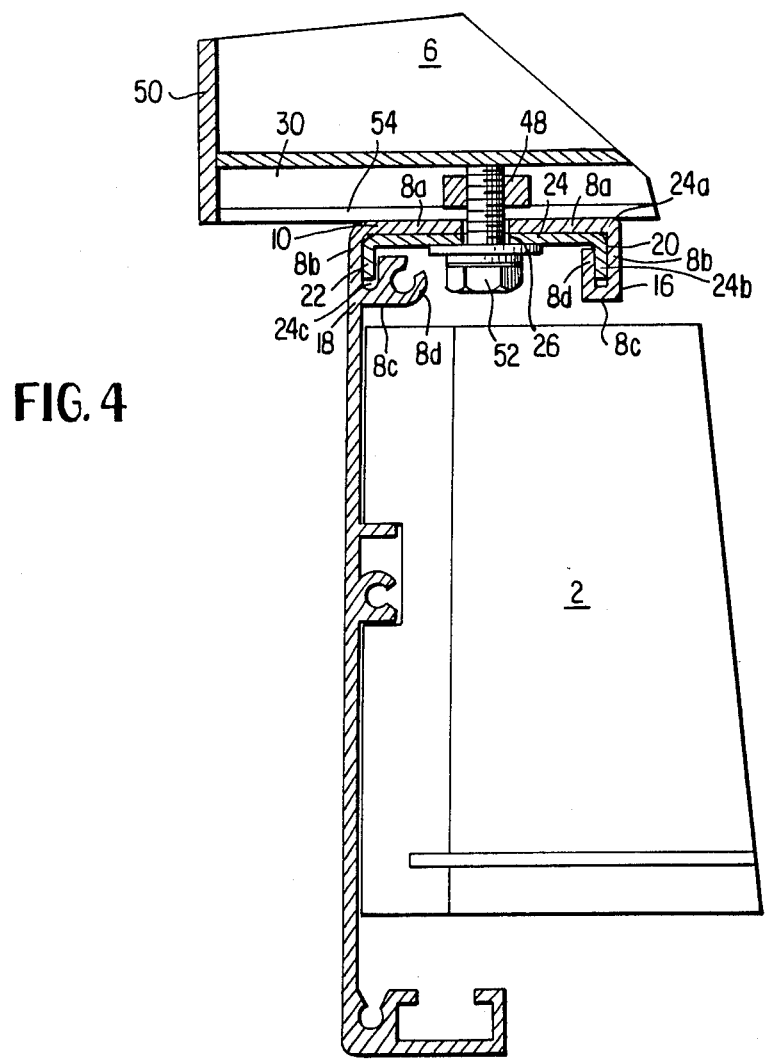
FIG. 4
FIG. 5
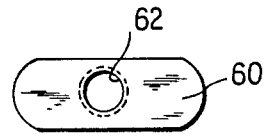
FIG. 6
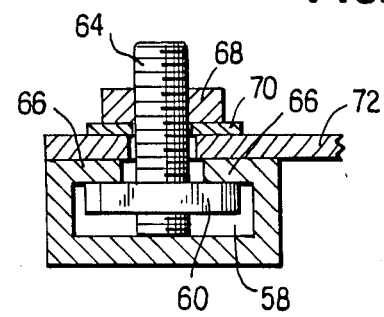

UNIVERSAL EQUIPMENT MOUNTING STRUCTURE

BACKGROUND OF THE INVENTION

This invention relates to a universal equipment mounting structure whereby various equipment components can be secured together for easy movement in the X-Y directions.

Although the invention is not restricted to any particular types of equipment, it will be specifically described with reference to a console repair system used to repair electronic components.

U.S. Pat. No. 4,471,898 disclosed a modular power supply having a case made up of top, bottom and side plates. Each plate has either a male or female portion at the edge which is slidably interconnectable with the edge of an adjacent plate. In addition, male and/or female portions located on the top, bottom and side plates matingly engage with similar female and/or male portions on a handle, output device receptacle, and the like.

SUMMARY OF THE INVENTION

In the present invention, a base has two pairs of spaced parallel rails with a longitudinal slot separating the rails of a pair. A depending portion depends from each rail of each pair and forms a partial trackway under each of the rails. A ⊓-shaped slider having an aperture therein in alignment with the slot is slidable in a complete trackway formed by two partial trackways under each pair of rails.

At least one third rail having a T-shaped longitudinal slot therein is orthogonally mounted on the two pairs of rails and a securing means, i.e., a bolt, passes through the aperture in the slider and is threaded into a nut in the T-shaped slot in the third rail in order to secure the structure together.

Generally, the third rail will be secured by two bolts each passing through one aperture and one slider, with one slider being mounted in each pair of rails.

The third rail may be part of console adapted to contain various controls or other equipment and the pairs of rails are mounted at the top sides of a cabinet which supports the console. A work table also may be mounted adjacent the console by being bolted to the pairs of rails at each side.

Further, the console may have one or more T-shaped slots in the top thereof to receive a nut which is of such a shape that it may be inserted into the T-shaped slot from the front thereof and then turned and locked by threading a headless bolt therein. The nut is elongated and thus, when turned so that when the longitudinal axis of the nut is at about 45 degrees with respect to the longitudinal axis of the T-shaped slot it can be secured against movement by turning a headless bolt therein. Other equipment items then may be secured to the other end of the headless bolt by means of a nut. Of course, a plurality of elongated nuts and headless bolts may be employed in T-shaped slots in the top of the console in order to secure equipment items at a number of points.

BRIEF DESCRIPTION OF THE DRAWINGS

The invention will be further illustrated by reference to the accompanying drawings in which:

FIGS. 1A and 1B taken together are a front view in elevation, partially broken away, showing a supporting cabinet, a work table and a console mounted on the cabinet where FIG. 1A is a cross sectional view taken on the lines 1A—1A of FIG. 3C.

FIG. 1C is a cross sectional view taken on the line 1C—1C of FIG. 3C.

FIG. 2 is a side view of the console and partial view of the work table taken on line 2—2 of FIG. 3B, and looking in the direction of the arrows, FIGS. 3A and 3B taken together are a fragmentary plan view of part of the console and a partial view of the work table taken on line 3—3 of FIG. 2, and looking in the direction of the arrows.

FIG. 4 is a detailed view cross sectional view taken on the line 4—4 of FIG. 3C showing the mounting of the console to the cabinet, FIG. 4A is a cross sectional view taken on the line 4A—4A of FIG. 3C.

FIG. 5 is a plan view of an elongated nut employed to secure equipment components in a T-shaped slot at the top of the console, and FIG. 6 shows the elongated nut of FIG. 5 secured in place by means of a headless bolt.

DESCRIPTION OF THE PREFERRED EMBODIMENT

Figure 1A:
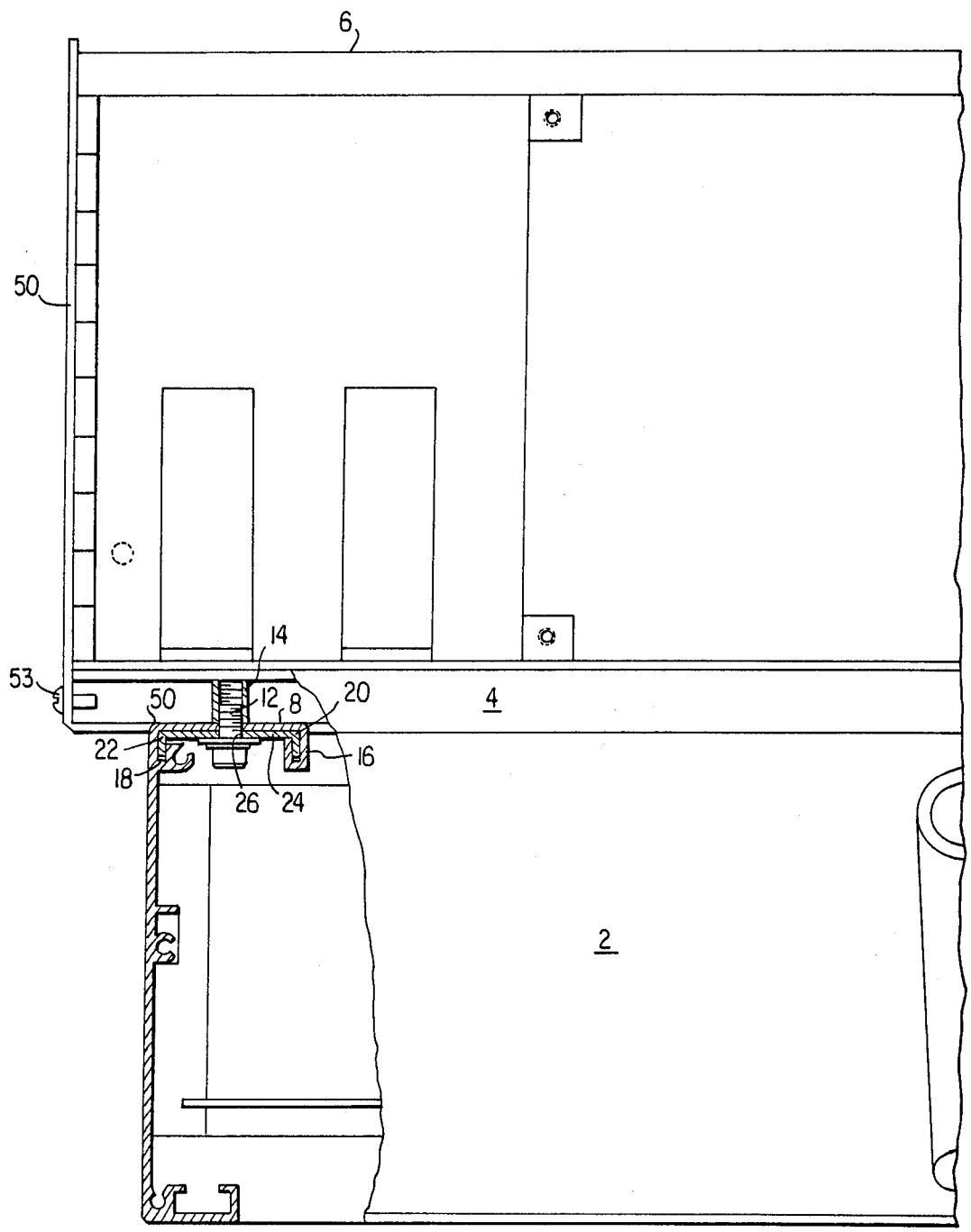
Figure 3C:
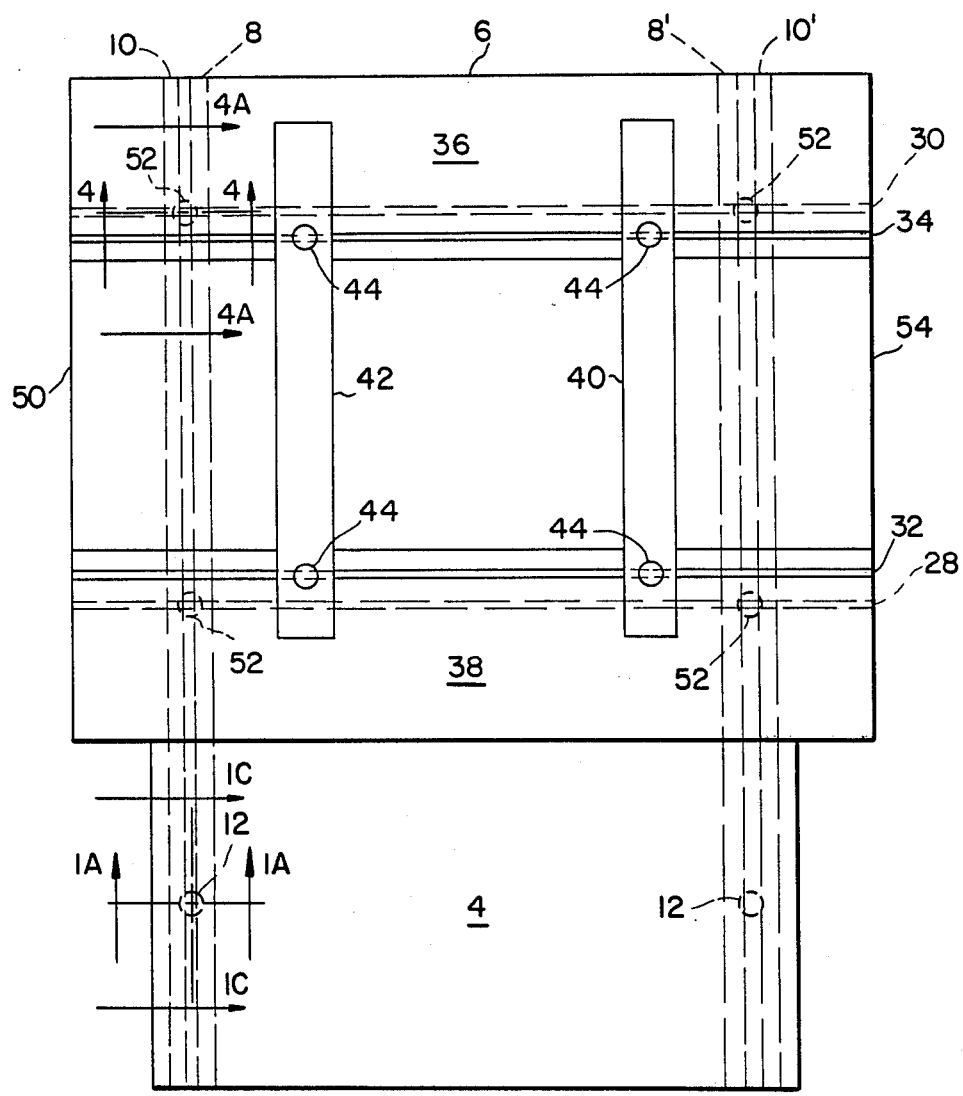
FIG. 3C is a cross sectional view taken on the line 3—3 of FIG. 2.

Referring to FIGS. 1A and 1B, the assembly includes the cabinet 2, which is shown partly broken away at FIG. 1A, having an optional work table 4 secured thereto and the console 6 secured to the cabinet 2 behind the work table 4 as shown in FIG. 3C. As shown at the left-hand side of FIG. 1A, a pair of rails 8 and 10 separated by a slot longitudinally extend into and out of the plane of the drawing, the length of the rails being approximately equal to the depth of the work table and the console in this embodiment, and are secured to the work table 4 by means of a threaded bolt 12 which engages the internal threads of a sleeve 14, which sleeve is received in a circular aperture in the work table 4 by means of a press fit or the like. The work table 4 may be made of wood or other similar material or of metal and, if of metal, the sleeve 14 is externally threaded into a threaded aperture in the work table 4.

As shown in FIG. 3C and as discussed above, there are typically two pairs of spaced parallel rails (8, 10 and 8', 10') where the work table is secured to both pairs of rails as shown in FIG. 3C.

Each of the rails 8 and 10 may be an extrusion and may have a depending portion 16 and 18 forming a partial trackway 20 and 22 therein which receives a substantially ⊓-shaped slider 24 having a central aperture 26 therein through which the bolt 12 passes. In particular, as can best be seen in FIG. 4, each rail includes a first horizontal extending leg 8a with one end adjacent the slot and the other end integral with a second leg 8b projecting downwardly from the first leg, a third leg 8c integral with the second leg projecting toward the second leg 8b of the other rail of the pair and a fourth leg 8d integral with the third leg and projecting toward the first leg 8a. The second, third, and fourth legs of the rails define the trackways 20 and 26 under each of the first legs 8a. Slider 24 has a first portion 24a with aperture 26 therein aligned with the slit between the pair of rails 8 and 10 and two downwardly extending portions 24b and 24c to form the ⊓-shape of slider 24. Each downward portion 24b and 24c is received by its respective trackway 20 and 22 of the rails.

Referring to FIG. 2, the console 6 is shown having a pair of T-shaped slots 28 and 30 in the bottom thereof as well as the T-shaped slots 32 and 34, which latter slots are in the top of a pair of base members 36 and 38, respectively, forming the bottom of the console and where members 36 and 38 may be extrusions and where slots 28, 30, 32 and 34 extend the lengths of their respective members.

The console also includes an extrusion 55 (FIG. 2) forming the top thereof. Side plates 50 and 51 are secured to the ends of extrusions 55, 36 and 38 via screws 53 which are threaded into tubular portions 57 on the extrusions, which portions also extend the length of their extrusions.

Figure 3A:
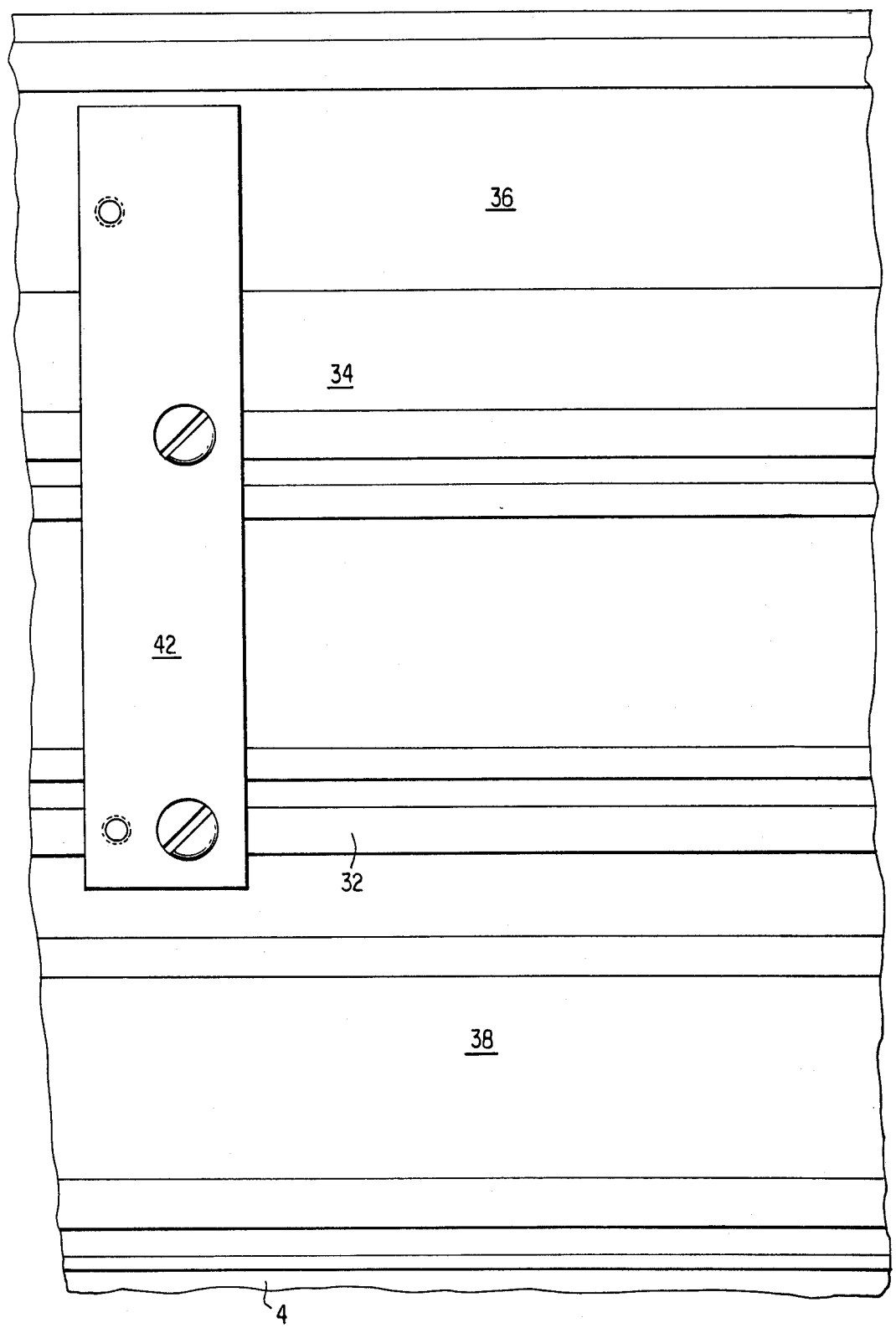

A pair of bars 40 and 42, as shown in FIG. 3, may be secured to the extrusions 36 and 38 by means of the bolts 44 which engage the nuts 46 in the T-shaped slots 32 and 34. The bars 40 and 42 are optionally employed to raise the level of the bed of the console to thereby support equipment items in an elevated position with respect to the extrusions 36 and 38.

Referring to FIG. 4, the mounting of the console 6 on the cabinet 2 is shown in detail.

Similarly to FIG. 1, the substantially π-shaped slider 24 has the depending arms 20 and 22 received in the portions 16 and 18 of the rails 8 and 10 where the length of the slider perpendicular to the plane of the paper may be about 1 inch and the width about 1¼ inch in the plane of the paper as illustrated in FIGS. 1C and 4A.

A nut 48 is inserted within the T-shaped slot 30 either prior to attaching the end plate 50 to the console 6 or subsequent to removing it therefrom. The nut is then slid into the T-shaped slot until it is positioned over the aperture in slider 24. The nut 48 is threadably engaged with the bolt 52 which bolt 52, when turned down, will engage the nut 48 against the bottom side 54 of the T-shaped slot 30 and thereby secure the π-shaped slider in position.

From the foregoing, it is apparent that inasmuch as the π-shaped slider 24 having the arms 20 and 22 may be moved longitudinally into and out of the plane of the drawing by releasing the bolt 52 and the console 6 may be moved transversely in the plane of the paper along the slots 28 and 30 with respect to the cabinet 2 when the bolt 52 is released, the console 6 may be moved in two orthogonal directions with respect to the cabinet 2. Generally speaking, the console 6 will be secured to the cabinet 2 by four sliders 24 and four bolts 52 and nuts 48 as shown in FIG. 3C, although only one is shown in FIG. 4.

Referring to FIG. 2, the extrusion 55 has a pair of longitudinal slots 56 and 58 therein which also extend the length of the extrusion. Various equipment items may be secured to the top of the console 6 in the slots 56 and 58 by using the nut shown in FIG. 5 and the nut and headless bolt assembly shown in FIG. 6.

Referring to FIG. 5, the nut 60 has an elongated shape and a threaded central aperture 62 therein. The width of the nut 60 is such that the nut may be dropped into slot 56 or 58 from the top and then turned to an approximately 45° angle such that it cannot be removed from the T-shaped slot through the top.

The nut 60 is shown in its secured position in the T-shaped groove 58 in FIG. 6 where the headless bolt 64 is threaded into the aperture 62 in the nut 60, thereby pulling the nut 60 upwardly to engage with the upper portions 66 of the T-shaped slot 58. A nut 68 threaded onto the headless bolt 64 will thus force the washer 70 against an equipment item 72 to be secured in place. Alternatively, an ordinary headed bolt may be employed instead of the headless bolt 64, if desired.

From the foregoing it is apparent that the present invention provides a method of connecting equipment components which is easy to use and permits rapid orthogonal movement of equipment components with respect to each other. Further, additional equipment components may be secured to the top of the console by means of the elongated nut and headless bolt disclosed herein whereby it is unnecessary to remove the end plates from the console to remove the elongated nut from the T-shaped slot in the top of the console, thereby facilitating rapid attachment and detachment of equipment items to the top of the console.

It will be obvious to those skilled in the art that many modifications may be made within the scope of the present invention without departing from the spirit thereof, and the invention includes all such modifications.

What is claimed is:

1. A mounting structure for selectively relative positioning and mounting together of a control console and a work table comprising in combination:
   - a control console;
   - a work table;
   - two pairs of spaced parallel rails;
   - said work table being mounted on said pairs of spaced rails,
   - a longitudinal slot separating each of said pair of spaced rails, a portion depending from each rail portion of each of said pair of spaced rails and forming a partial trackway under each of said pair of spaced rails;
   - a channel-shaped slider having an aperture therein and in alignment with said slot, each of said partial trackways forming a complete trackway under each of said pair of spaced rails which receives said channel-shaped slider,
   - at least one third rail having a T-shaped longitudinal slot therein, said third rail orthogonally mounted on said pairs of rails, said third rail being positionable with respect to said pairs of spaced parallel rails in a first direction parallel to the direction of the rails and in a second direction parallel to the third rail and orthogonal to the first direction,
   - said control console being secured to said third rail adjacent said work table, and
   - securing means in said T-shaped slot and said aperture for connecting said third rail to said two pairs of rails to form the mounting structure wherein the third rail may be positioned with respect the two pairs of rails at any position (a) along the length of said two pairs of rails and (b) transverse with respect to said two pairs of rails.

2. A mounting structure according to claim 1 in which said securing means is a bolt passing through said aperture and engaging a nut in said T-shaped slot.

3. A mounting structure according to claim 1, including a plurality of third rails, each having a T-shaped longitudinal slot therein, orthogonally mounted on said pairs of rails.

4. A mounting structure according to claim 1 in which said two pairs of rails are extrusions.

5. A mounting structure comprising two pairs of spaced parallel rails, a longitudinal slot separating each of said pair of spaced rails, a portion depending from each rail portion of each pair of spaced rails and forming a partial trackway under each of said pair of spaced rails,
- a channel-shaped slider having an aperture therein and in alignment with said slot, each of said partial trackways forming a complete trackway under each of said pair of spaced rails which receives said channel-shaped slider,
- at least one third rail having a T-shaped longitudinal slot therein, said third rail orthogonally mounted on said pairs of rails, said third rail being positionable with respect to said pairs of spaced parallel rails in a first direction parallel to the direction of the rails and in a second direction parallel to the third rail and orthogonal to the first direction, and
- securing means in said T-shaped slot and said aperture for connecting said third rail to said two pairs of rails to form the mounting structure wherein the third rail may be positioned with respect the two pairs of rails at any position (a) along the length of said two pairs of rails and (b) transverse with respect to the rails, including a control console secured to said third rail adjacent said work table, wherein said control console has a top and including a longitudinal T-shaped slot in the top of said control console.

6. A mounting structure according to claim 5 including a headless bolt in said T-shaped slot in the top of said control console, said headless bolt having a nut at each end, at least one of said nuts being of a size and shape such that it can be inserted through said slot, turned, and secured against movement by turning said headless bolt.

7. A mounting structure for mounting a console and a base member together, comprising in combination:
- a base member;
- a console member;
- two pairs of spaced apart rails with a longitudinal slot separating each of said pair;
- means for receiving a pair of apertured sliders respectively within an associated pair of said spaced apart rails wherein the aperture in each slider is maintained in alignment with its associated longitudinal slot,
- at least one third rail having a longitudinal slot therein, said third rail orthogonally mounted with respect to said pairs of rails, said third rail being positionable with respect to said pairs of spaced rails in a first direction parallel to the direction of the rails and in a second direction parallel to the third rail and orthogonal to the first direction,
- securing means in said third rail slot and said apertures for connecting said third rail to said two pairs of rails to form the mounting structure wherein the third rail may be positioned with respect the two pairs of rails at any position (a) along the length of said two pairs of rails and (b) transverse with respect to said two pairs of rails,
- one of said base member and said console having said third rail fixedly attached therein, and
- said means for securing including means for securing said one of said base member and said console to both of said two pairs of rails.

8. A mounting structure as in claim 7 wherein said console is mounted on said base member.

9. A mounting structure as in claim 7 wherein said base member has said third rail included therein and wherein said securing means includes means for securing said base member to both said two pairs of rails.

10. A mounting structure as in claim 9 wherein said console is mounted on said base member.

* * * * *